United States Patent
Haji-Rahim et al.

(10) Patent No.: US 11,784,136 B2
(45) Date of Patent: Oct. 10, 2023

(54) INTEGRATED MODULE WITH ELECTROMAGNETIC SHIELDING

(71) Applicant: Qorvo US, Inc., Greensboro, NC (US)

(72) Inventors: Mohsen Haji-Rahim, Chapel Hill, NC (US); Howard Joseph Holyoak, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/467,598

(22) Filed: Sep. 7, 2021

(65) Prior Publication Data

US 2021/0398914 A1 Dec. 23, 2021

Related U.S. Application Data

(62) Division of application No. 16/544,145, filed on Aug. 19, 2019, now Pat. No. 11,139,250, which is a
(Continued)

(51) Int. Cl.
*H01L 23/552* (2006.01)
*H01L 23/532* (2006.01)
(Continued)

(52) U.S. Cl.
CPC ............ *H01L 23/552* (2013.01); *H01L 21/56* (2013.01); *H01L 21/561* (2013.01); *H01L 21/78* (2013.01); *H01L 23/16* (2013.01); *H01L 23/3121* (2013.01); *H01L 23/53223* (2013.01); *H01L 23/53238* (2013.01); *H01L 23/53252* (2013.01); *H01L 24/16* (2013.01); *H01L 24/48* (2013.01); *H01L 25/0655* (2013.01); *H01L 25/16* (2013.01); *H01L 2224/16227* (2013.01); *H01L 2224/48227* (2013.01);
(Continued)

(58) Field of Classification Search
None
See application file for complete search history.

(56) References Cited

U.S. PATENT DOCUMENTS 6,566,596 B1  5/2003  Askew
10,410,972 B2  9/2019  Haji-Rahim et al.
(Continued)

OTHER PUBLICATIONS

Non-Final Office Action for U.S. Appl. No. 15/903,243, dated Mar. 14, 2019, 5 pages.
(Continued)

*Primary Examiner* — Long Pham
(74) *Attorney, Agent, or Firm* — Withrow & Terranova, P.L.L.C.

(57) ABSTRACT

The present disclosure relates to a shielded integrated module, which includes a module substrate with a number of perimeter bond pads, at least one electronic component attached to the module substrate and encapsulated by a mold compound, a number of perimeter vertical shield contacts, and a shielding structure. The perimeter bond pads are surrounding the at least one electronic component and encapsulated by the mold compound. Each perimeter vertical shield contact is coupled to a corresponding perimeter bond pad and extends through the mold compound, such that a top tip of each perimeter vertical shield contact is exposed at a top surface of the mold compound. The shielding structure completely covers the top surface of the mold compound and is in contact with the perimeter vertical shield contacts.

15 Claims, 7 Drawing Sheets

Figure 1A:
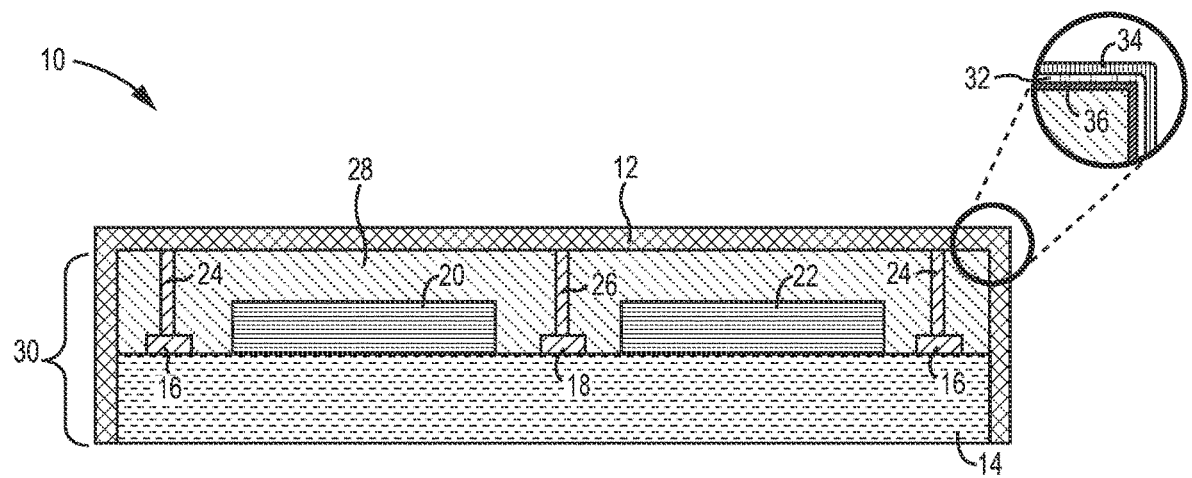

Related U.S. Application Data division of application No. 15/903,243, filed on Feb. 23, 2018, now Pat. No. 10,410,972.

(60) Provisional application No. 62/462,455, filed on Feb. 23, 2017.

(51) Int. Cl.

| | | |
|---|---|---|
| *H01L 21/78* | (2006.01) | |
| *H01L 21/56* | (2006.01) | |
| *H01L 23/16* | (2006.01) | |
| *H01L 23/31* | (2006.01) | |
| *H01L 23/00* | (2006.01) | |
| *H01L 25/065* | (2023.01) | |
| *H01L 25/16* | (2023.01) | |

(52) U.S. Cl.
CPC ...... *H01L 2224/97* (2013.01); *H01L 2924/19041* (2013.01); *H01L 2924/19042* (2013.01); *H01L 2924/19043* (2013.01); *H01L 2924/19107* (2013.01); *H01L 2924/3025* (2013.01)

(56) References Cited

U.S. PATENT DOCUMENTS

| | | |
|---|---|---|
| 11,139,250 B2 | 10/2021 | Haji-Rahim et al. |
| 2016/0035680 A1 | 2/2016 | Wu |
| 2018/0076148 A1 | 3/2018 | Nguyen et al. |
| 2018/0240759 A1 | 8/2018 | Haji-Rahim et al. |
| 2019/0371740 A1 | 12/2019 | Haji-Rahim et al. |
| 2020/0066547 A1 | 2/2020 | Huemoeller et al. |

OTHER PUBLICATIONS

Notice of Allowance for U.S. Appl. No. 15/903,243, dated May 1, 2019, 6 pages.

Quayle Action for U.S. Appl. No. 16/544,145, dated Feb. 1, 2021, 5 pages.

Notice of Allowance for U.S. Appl. No. 16/544,145, dated Jun. 8, 2021, 8 pages.

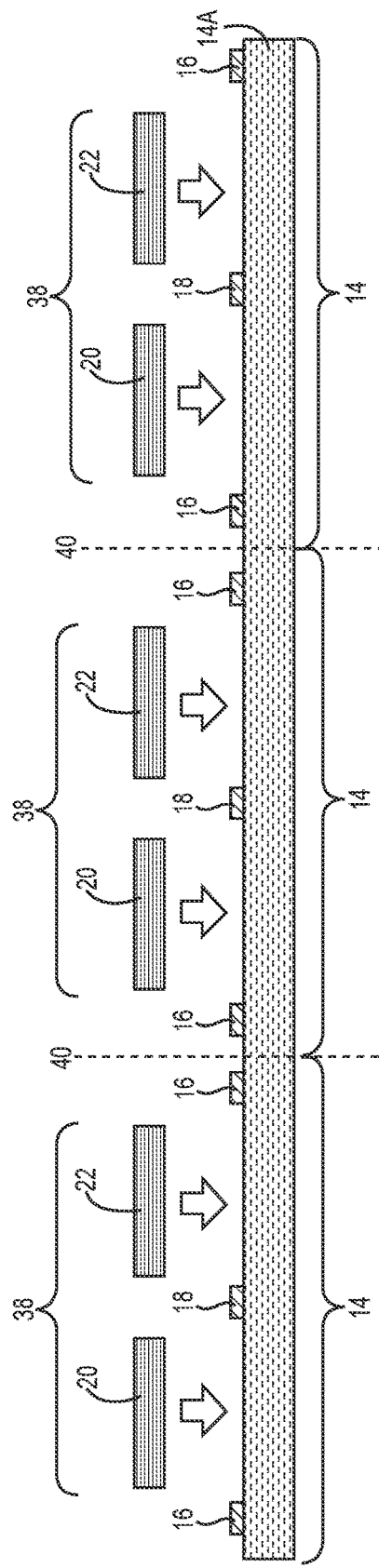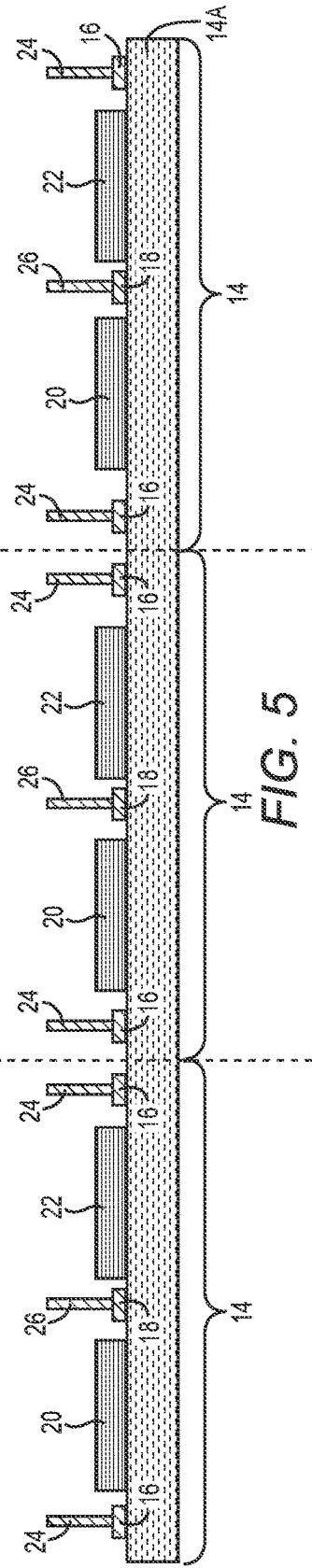

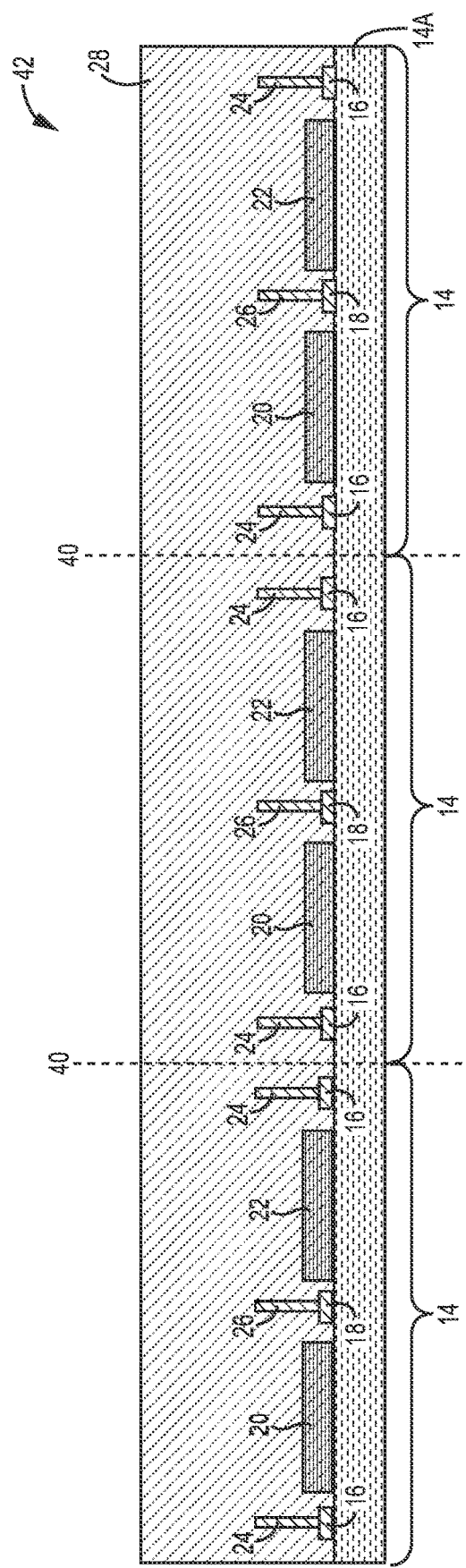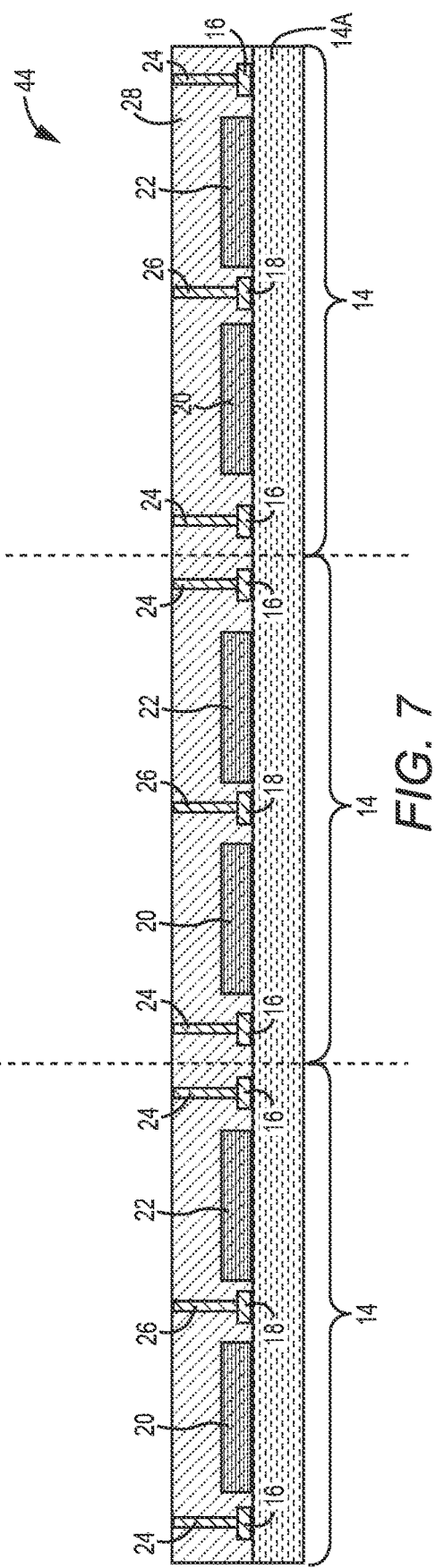

INTEGRATED MODULE WITH ELECTROMAGNETIC SHIELDING

RELATED APPLICATIONS

This application claims priority to and is a divisional application of U.S. patent application Ser. No. 16/544,145, filed Aug. 19, 2019, now U.S. Pat. No. 11,139,250. U.S. patent application Ser. No. 16/544,145 is a divisional of U.S. patent application Ser. No. 15/903,243, filed on Feb. 23, 2018, now U.S. Pat. No. 10,410,972, which claims the benefit of provisional patent application Ser. No. 62/462,455, filed Feb. 23, 2017, the disclosures of which are hereby incorporated herein by reference in their entireties.

FIELD OF THE DISCLOSURE

The present disclosure relates to an integrated module and a process for making the same, and more particularly to an integrated module with electromagnetic shielding, and a process to provide the electromagnetic shielding for the integrated module.

BACKGROUND

Electronic components have become ubiquitous in modern society. The electronics industry proudly, but routinely, announces accelerated clocking speeds and smaller integrated modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed inherently means higher frequencies. Higher frequencies mean shorter wavelengths. Shorter wavelengths mean that shorter conductive elements act as antennas to broadcast these electromagnetic emissions. These electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have lots of radiating elements that raise EMI concerns. Thus, even electronic modules that do not have high clock speeds may have EMI issues.

One way to reduce EMI is to shield the integrated modules that cause EMI or that are sensitive to EMI. Typically, the shield is formed from a conductive material that covers the top and at least a portion of the side of one circuit module. When electromagnetic emissions from the circuit module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the module does not suffer EMI from other modules.

However, as the integrated modules continue to become smaller from miniaturization, creating effective shields that do not materially add to the size of the module becomes more difficult. Thus, there is a need for an electromagnetic shield that is inexpensive to manufacture on a large scale, does not substantially change the size of the integrated module, and effectively deals with EMI concerns.

SUMMARY

The present disclosure relates to an integrated module with electromagnetic shielding, and a process for making the same. The disclosed shielded integrated module is formed from an integrated module and a shielding structure. The integrated module includes a module substrate with a number of perimeter bond pads, at least one electronic component, a mold compound, and a number of perimeter vertical shield contacts. The at least one electronic component is attached to a top surface of the module substrate. The perimeter bond pads are formed on the top surface of the module substrate, surrounding the at least one electronic component, and electrically coupled to ground. The mold compound resides over the top surface of the module substrate and encapsulates the at least one top electronic component. Herein, a top surface of the integrated module is a top surface of the mold compound, a bottom surface of the integrated module is a bottom surface of the module substrate, and a side surface of the integrated module is a combination of a side surface of the mold compound and a side surface of the module substrate. Each perimeter vertical shield contact is bonded to a corresponding perimeter bond pad, and extends through the mold compound, such that a top tip of each perimeter vertical shield contact is exposed at the top surface of the integrated module. The shielding structure completely covers the top surface of the integrated module and is in contact with the perimeter vertical shield contacts.

In one embodiment of the shielded integrated module, the shielding structure completely covers the side surface of the integrated module without covering the bottom surface of the integrated module.

In one embodiment of the shielded integrated module, the shielding structure includes a first layer completely covering the top surface and the side surface of the integrated module, and a second layer over the first layer. Herein, the first layer is formed of copper, aluminum, silver, or gold, and the second layer is formed of nickel.

In one embodiment of the shielded integrated module, a thickness of the first layer is between 3 µm and 16 µm, and a thickness of the second layer is between 1 µm and 3 µm.

In one embodiment of the shielded integrated module, the perimeter bond pads are formed from electroless nickel electroless palladium immersion gold (ENEPIG) or electroless nickel immersion gold (ENIG). The perimeter vertical shield contacts are formed of copper, gold, or alloy.

In one embodiment of the shielded integrated module, a distance between each perimeter bond pad and the at least one electronic component is between 60 µm and 100 µm.

In one embodiment of the shielded integrated module, the at least one electronic component is at least one of a flip-chip die, a wire-bonding die, a surface mounted device (SMD), an inductor, a capacitor, and a resistor.

In one embodiment of the shielded integrated module, the at least one electronic component includes a first electronic component and a second electronic component. Herein, the perimeter bond pads surround the first electronic component and the second electronic component.

In one embodiment of the shielded integrated module, the integrated module further includes a number of interior bond pads, and a number of interior vertical shield contacts. The interior bond pads are formed on the top surface of the module substrate, located between the first electronic component and the second electronic component, and electrically coupled to ground. Each interior vertical shield contact is bonded to a corresponding interior bond pad, and extends through the mold compound, such that a top tip of each interior vertical shield contact is exposed at the top surface of the integrated module. The shielding structure is in contact with the interior vertical shield contacts.

According to an exemplary process, a precursor package having a number of integrated modules is provided initially. Herein, an inter-module area is horizontally in between two adjacent integrated modules. Each integrated module includes a module substrate with a number of perimeter bond pads, at least one electronic component, a mold compound, and a number of perimeter vertical shield contacts. The at least one electronic component and the perimeter bond pads are on a top surface of the module substrate and encapsulated by the mold compound. The perimeter bond pads surround the at least one electronic component and are electrically coupled to ground. Each perimeter vertical shield contact is coupled to a corresponding perimeter bond pad, and extends through the mold compound, such that a top tip of each perimeter vertical shield contact is exposed at a top surface of the mold compound. Next, the precursor package is singulated at each inter-module area to form a number of individual integrated modules. A top surface of each individual integrated module is a top surface of the mold compound, a bottom surface of each individual integrated module is a bottom surface of the module substrate, and a side surface of each individual integrated module is a combination of a side surface of the mold compound and a side surface of the module substrate. Finally, a shielding structure is applied to each individual integrated module. The shielding structure completely covers the top surface and the side surface of each individual integrated module, and is in contact with the perimeter vertical shield contacts.

In one embodiment of the exemplary process, providing the precursor package includes attaching the at least one electronic component to a corresponding module substrate, such that the perimeter bond pads on the corresponding module substrate surround the at least one electronic component, forming each perimeter vertical shield contact coupled to the corresponding perimeter bond pad, applying the mold compound over each module substrate to encapsulate the at least one electronic component, the perimeter bond pads, and the perimeter vertical shield contacts, and thinning the mold compound to expose the top tip of each perimeter vertical shield contact.

In one embodiment of the exemplary process, forming each perimeter vertical shield contact is provided by a wire bonding process.

In one embodiment of the exemplary process, thinning the mold compound is provided by a mechanical grinding process.

In one embodiment of the exemplary process, the at least one electronic component includes a first electronic component and a second electronic component. The perimeter bond pads surround the first electronic component and the second electronic component.

In one embodiment of the exemplary process, each integrated module further includes a number of interior bond pads, and a number of interior vertical shield contacts. Herein, the interior bond pads are formed on the top surface of the corresponding module substrate, located between the first electronic component and the second electronic component, and electrically coupled to ground. Each interior vertical shield contact is bonded to a corresponding interior bond pad, and extends through the mold compound, such that a top tip of each interior vertical shield contact is exposed at the top surface of the mold compound. The shielding structure is in contact with the interior vertical shield contacts.

In one embodiment of the exemplary process, the shielding structure includes a first layer completely covering the top surface and the side surface of each individual integrated module, and a second layer over the first layer. The first layer is formed of copper, aluminum, silver, or gold, and the second layer is formed of nickel.

In one embodiment of the exemplary process, the first layer is formed by an electrolytic plating process and the second layer is formed by at least one of an electroless plating process and an electrolytic plating process.

According to an exemplary process, a precursor package having a number of integrated modules is provided initially. Herein, an inter-module area is horizontally in between two adjacent integrated modules. Each integrated module includes a module substrate with a number of perimeter bond pads, at least one electronic component, a mold compound, and a number of perimeter vertical shield contacts. The at least one electronic component and the perimeter bond pads are on a top surface of the module substrate and encapsulated by the mold compound. The perimeter bond pads surround the at least one electronic component and are electrically coupled to ground. Each perimeter vertical shield contact is bonded to a corresponding perimeter bond pad, and extends through the mold compound, such that a top tip of each perimeter vertical shield contact is exposed at a top surface of the mold compound. Next, a shielding structure is applied to the precursor package to form a shielded package. The shielding structure completely covers a top surface and a side surface of the precursor package, such that the shielding structure is in contact with the perimeter vertical shield contacts associated with each integrated module. Finally, the shielded package is singulated at each inter-module area to form a number of shielded integrated modules. Herein, a top surface of each shielded integrated module is completely covered by the shielding structure, and the shielding structure for each shielded integrated module remains in contact with the perimeter vertical shield contacts.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1B:
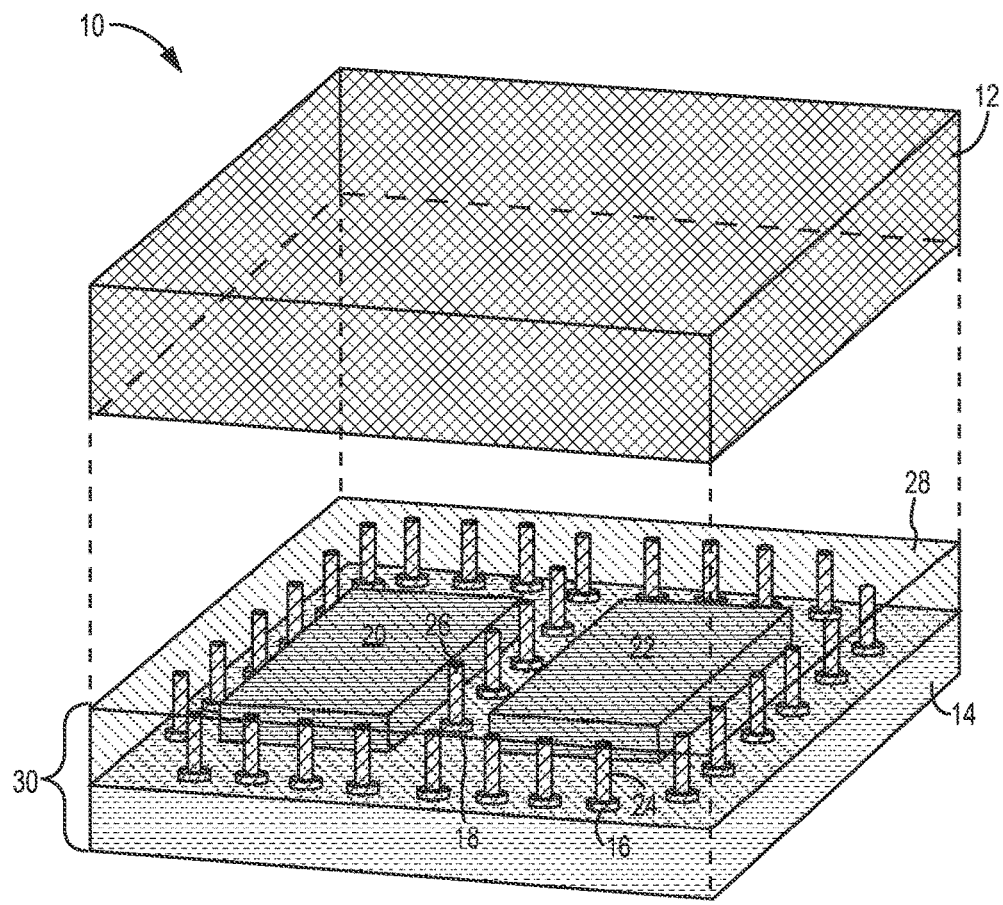

FIGS. 1A-1B provide an exemplary shielded integrated module according to one embodiment of the present disclosure.

Figure 2A:
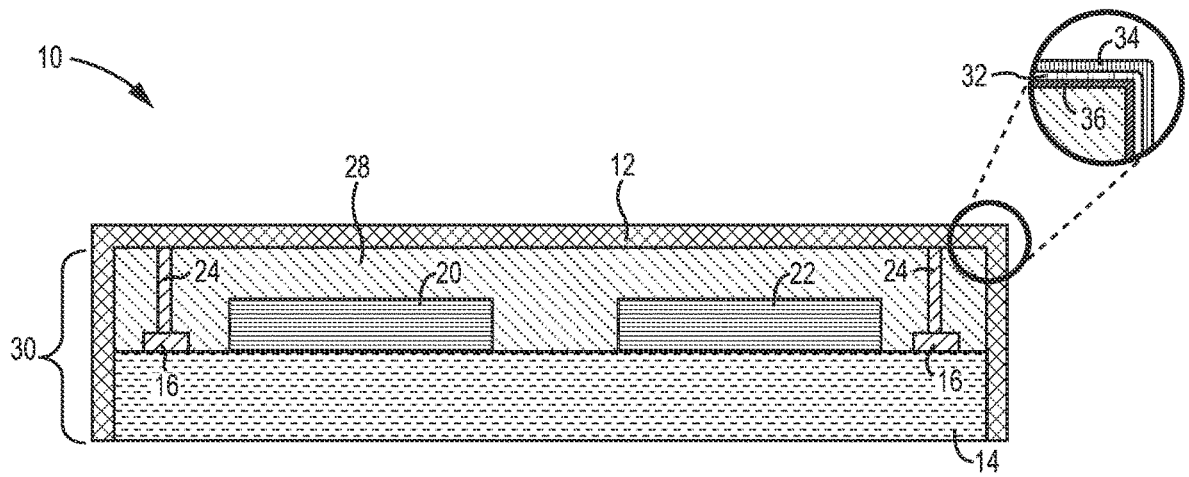
Figure 2B:
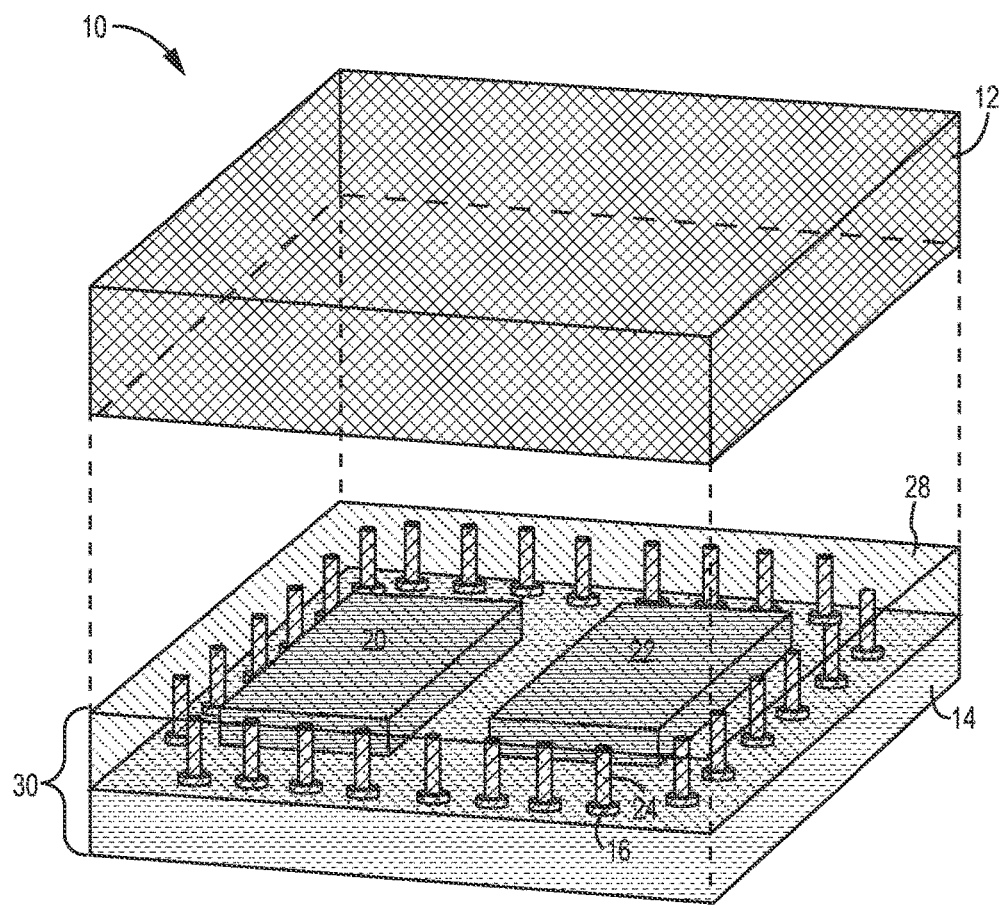

FIGS. 2A-2B provide an alternative shielded integrated module according to one embodiment of the present disclosure.

Figure 3A:
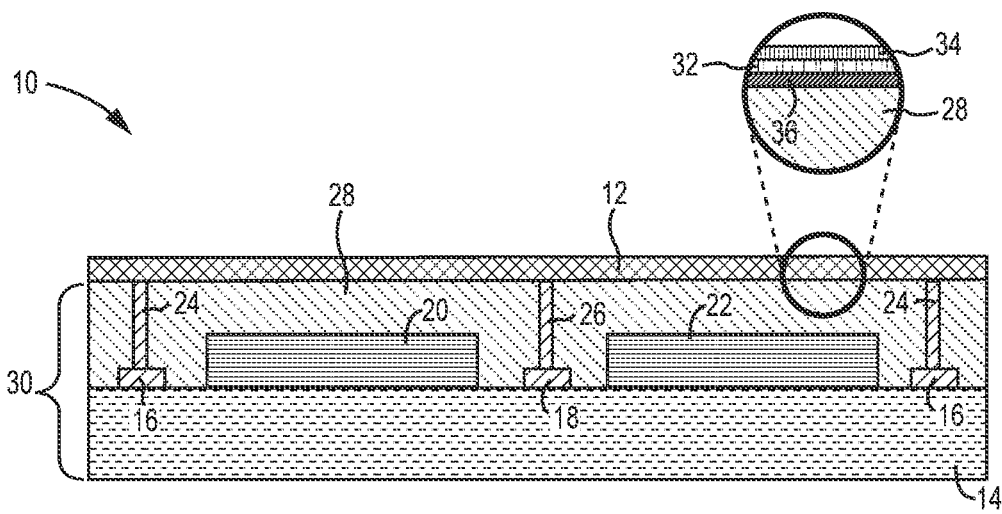
Figure 3B:
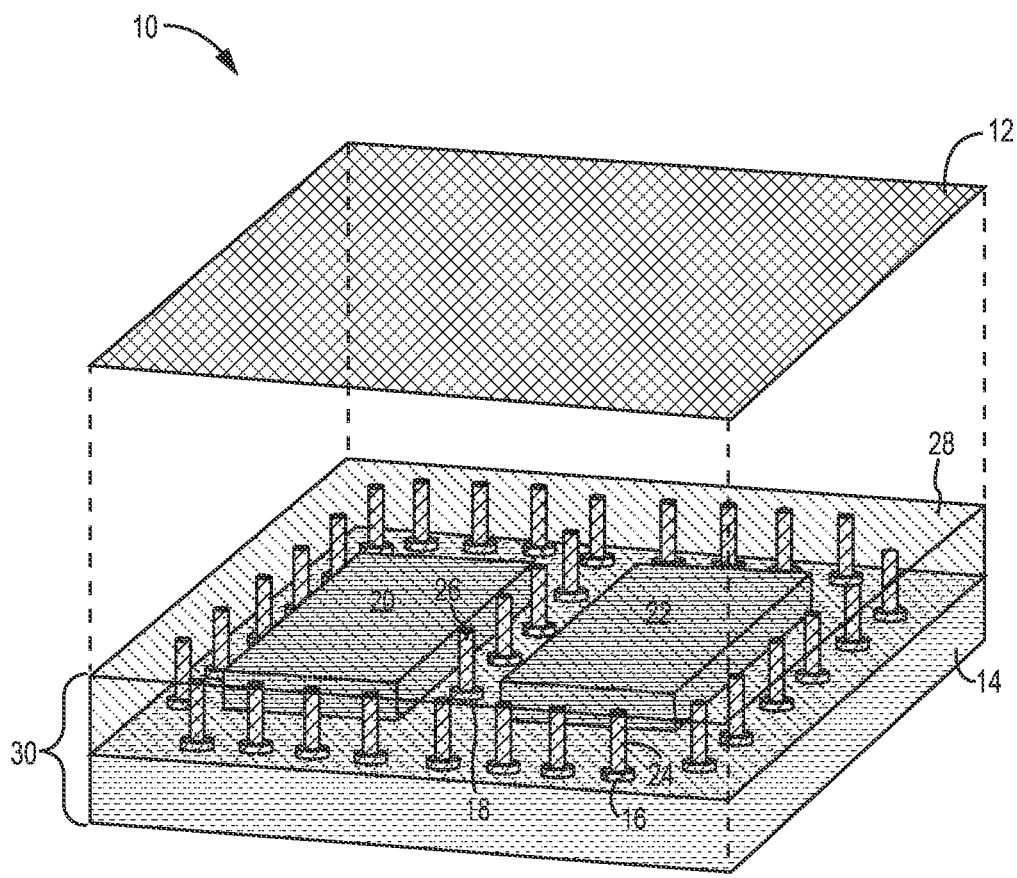

FIGS. 3A-3B provide an alternative shielded integrated module according to one embodiment of the present disclosure.

FIGS. 4-9 provide exemplary steps that illustrate a process to form the exemplary shielded integrated module shown in FIG. 1A.

Figure 10:
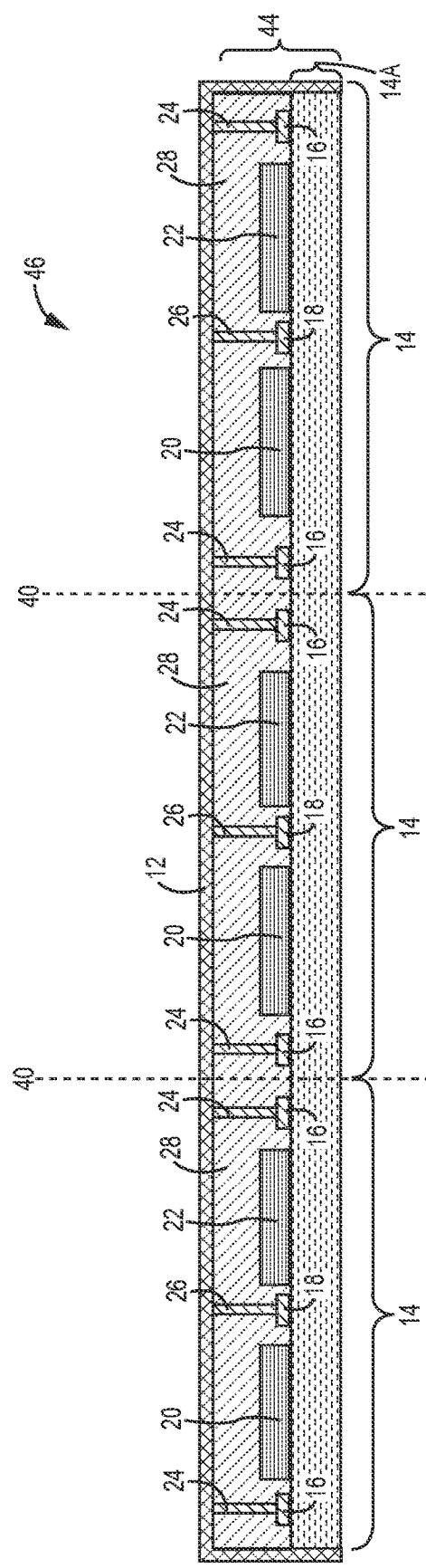
Figure 11:
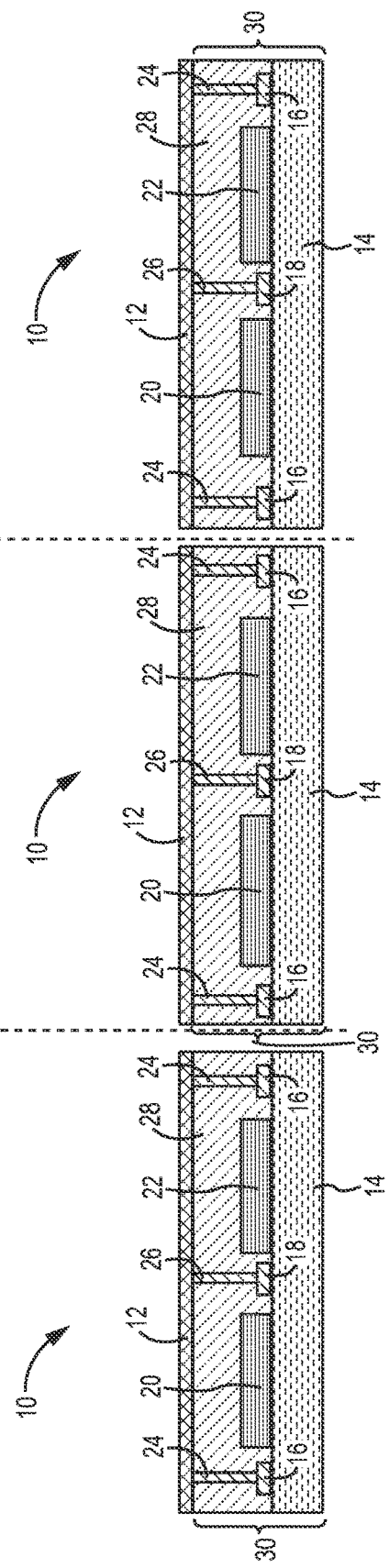

FIGS. 10-11 provide exemplary steps that illustrate a process to form the exemplary shielded integrated module shown in FIG. 3A.

It will be understood that for clear illustrations, FIGS. 1-11 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to an integrated module with electromagnetic shielding, and a process for making the same. FIGS. 1A and 1B (separating elements for clarity) provide an exemplary shielded integrated module 10 according to one embodiment of the present disclosure. For the purpose of this illustration, the exemplary shielded integrated module 10 includes a shielding structure 12, a module substrate 14 with perimeter bond pads 16 and interior bond pads 18, a first electronic component 20, a second electronic component 22, perimeter vertical shield contacts 24, interior vertical shield contacts 26, and a mold compound 28 (only one/two perimeter bond pad(s), one/two perimeter vertical shield contact(s), one interior bond pad, and one interior vertical shield contact are labeled with a reference number for clarity). Herein, the module substrate 14, the first electronic component 20, the second electronic component 22, the perimeter bond pads 16, the interior bond pads 18, the perimeter vertical shield contacts 24, the interior vertical shield contacts 26, and the mold compound 28 form an integrated module 30 without shielding.

In detail, the module substrate 14 may be a laminate having a number of laminate layers and a ground plane (not shown for simplification and clarity). These laminate layers of the module substrate 14 may include prepreg material, and the ground plane is in the interior portion of the module substrate 14. The perimeter bond pads 16 and the interior bond pads 18 are formed on the top surface of the module substrate 14, and electrically coupled to the ground plane within the module substrate 14 (not shown). The perimeter bond pads 16 and the interior bond pads 18 may be formed from the same materials, such as electroless nickel electroless palladium immersion gold (ENEPIG), electroless nickel immersion gold (ENIG), or any metal suitable for wire-bonding.

The first electronic component 20 and the second electronic component 22 are attached to a top surface of the module substrate 14. In different applications, the shielded integrated module 10 may include fewer or more electronic components. The first electronic component 20/the second electronic component 22 may be a flip-chip die, a wire-bonding die, a surface mounted device (SMD), an inductor, a capacitor, a resistor or other active/passive component. Herein, the perimeter bond pads 16 may be located along the periphery of the top surface of the module substrate 14 and surround the first electronic component 20 and the second electronic component 22. The interior bond pads 18 are located between the first electronic component 20 and the second electronic component 22. Each perimeter bond pad 16 is apart from the first electronic component 20/the second electronic component 22 with a first distance between 60 µm and 100 µm (the first distance for each perimeter bond pad 16 may be different). Similarly, each interior bond pad 18 is apart from the first electronic component 20/the second electronic component 22 with a second distance between 60

μm and 100 μm (the second distance for each interior bond pad 18 may be different). One perimeter bond pad 16 is apart from an adjacent perimeter/interior bond pad 20/22 with a third distance between 40 μm and 80 μm (the third distance for different adjacent bond pad pairs may be different). Within the design constraint, the number of the perimeter bond pads 16, the number of the interior bond pads 18, and the configuration of the perimeter and interior bond pads 20 and 22 depends on the size of the shielded integrated module 10 and the configuration of the first and second electronic components 20 and 22.

The mold compound 28 resides over the top surface of the module substrate 14 and encapsulates the first electronic component 20, the second electronic component 22, the perimeter bond pads 16, and the interior bond pads 18. The mold compound 28 may be an organic epoxy resin system. Each perimeter vertical shield contact 24 is bonded to a corresponding perimeter bond pad 16, and extends through the mold compound 28, such that a top tip of each perimeter vertical shield contact 24 is exposed at a top surface of the mold compound 28. The perimeter vertical shield contacts 24 are bonded to ground via the perimeter bond pads 16, and surround the first electronic component 20 and the second electronic component 22. Each interior vertical shield contact 26 is bonded to a corresponding interior bond pad 18, and extends through the mold compound 28, such that a top tip of each interior vertical shield contact 26 is exposed at the top surface of the mold compound 28. The interior vertical shield contacts 26 are coupled to ground via the interior bond pads 18, and located between the first electronic component 20 and the second electronic component 22. A height of each perimeter vertical shield contact 24/interior vertical shield contact 26 is taller than a height of the first electronic component 20/the second electronic component 22. Therefore, when the top tip of each perimeter vertical shield contact 24/interior vertical shield contact 26 is exposed at the top surface of the mold compound 28, the first electronic component 20 and the second electronic component 22 are still fully encapsulated by the mold compound 28. The perimeter vertical shield contacts 24 and the interior vertical shield contacts 26 may be formed from the same material(s), such as copper, gold, metal alloy, or other material suitable for wire-bonding.

In this embodiment, the top surface of the mold compound 28 is a top surface of the integrated module 30, a bottom surface of the module substrate 14 is a bottom surface of the integrated module 30, and a combination of a side surface of the mold compound 28 and a side surface of the module substrate 14 is a side surface of the integrated module 30. The shielding structure 12 completely covers the top surface and the side surface of the integrated module 30, while the bottom surface of the integrated module 30 is exposed. As such, the shielding structure 12 is in contact with the perimeter vertical shield contacts 24 and the interior vertical shield contacts 26 at the top surface of the integrated module 30. The shielding structure 12 is electrically coupled to ground via the perimeter vertical shield contacts 24 and the perimeter bond pads 16, and/or via the interior vertical shield contacts 26 and the interior bond pads 18. A combination of the shielding structure 12, the perimeter vertical shield contacts 24, and the perimeter bond pads 16 provides external shielding for the integrated module 30 from the external environment. A combination of the interior vertical shield contacts 26 and the interior bond pads 18 provides internal shielding between the first electronic component 20 and the second electronic component 22. Herein and hereafter, completely covering a surface refers to covering at least 95% of the surface.

The shielding structure 12 includes at least a first layer 32 and a second layer 34. The first layer 32 completely covers the top surface and the side surface of the integrated module 30, and may be formed of copper, aluminum, silver, gold, or other conductive materials with a thickness between 3 μm and 16 μm. The second layer 34 resides over the first layer 32, and may be formed of nickel with a thickness between 1 μm and 3 μm. In order to achieve a superior adhesion, the shielding structure 12 may further include a seed layer 36 formed of copper, aluminum, silver, gold, or other conductive materials with a thickness between 0.5 μm and 1.5 μm. The seed layer 36 may directly and completely cover the top surface and the side surface of the integrated module 30, and the first layer 32 resides over the seed layer 36.

In some applications, the first electronic component 20 may communicate with the second electronic component 22, and there is no internal shielding needed between the first electronic component 20 and the second electronic component 22. As shown in FIGS. 2A and 2B, the shielded integrated module 10 does not include the interior bond pads 18 and the interior vertical shield contacts 26. The shielding structure 12, which completely covers the top surface and the side surface of the integrated module 30, is electrically coupled to ground only via the perimeter vertical shield contacts 24 and the perimeter bond pads 16. Since there is no interior bond pad 18 or interior vertical shield contact 26 between the first electronic component 20 and the second electronic component 22, a distance between the first electronic component 20 and the second electronic component 22 may be reduced as short as 80 μm for flip chips and 150 μm for wire-bonding chips.

In some applications, the shielding structure 12 may only cover the top surface of the integrated module 30, while the bottom surface and the side surface of the integrated module 30 are exposed, as illustrated in FIGS. 3A and 3B. Since the perimeter vertical shield contacts 24 are coupled to ground (via the perimeter bond pads 16), surround the first electronic component 20 and the second electronic component 22, and vertically extend through the mold compound 28, the first electronic component 20 and the second electronic component 22 are still partially encased by a grounded structure formed by the shielding structure 12 (only covers the top surface of the shielded integrated module 10), the perimeter vertical shield contacts 24, and the perimeter bond pads 16. Therefore, a combination of the shielding structure 12 (only covers the top surface of the shielded integrated module 10), the perimeter vertical shield contacts 24, and the perimeter bond pads 16 still provides external shielding for the integrated module 30 from the external environment.

FIGS. 4-9 provide exemplary steps that illustrate a process to fabricate the exemplary shielded integrated module 10 shown in FIG. 1A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-9.

Initially, a number of electronic component groups 38 are attached to a top surface of a package substrate 14A as depicted in FIG. 4. The electronic component groups 38 may be attached to the package substrate 14A via an adhesive material (not shown). The package substrate 14A includes a number of the module substrates 14, and a number of inter-module areas 40, each of which is in between adjacent module substrates 14. Herein, each electronic component group 38 is attached to a corresponding module substrate 14 and does not reside on any inter-module area 40. In this embodiment, each electronic component group 38 includes the first electronic component 20 and the second electronic component 22. In different applications, each electronic component group 38 may include fewer or more electronic components. The perimeter bond pads 16 on the corresponding module substrate 14 surround the corresponding electronic component group 38, and the interior bond pads 18 on the corresponding module substrate 14 are located between the first electronic component 20 and the second electronic component 22. In some applications, there may be no interior bond pad 18 on the corresponding module substrate 14, such that there may be no interior bond pad 18 between the first electronic component 20 and the second electronic component 22. A plasma cleaning process (not shown) may be followed to clean the top surface of the package substrate 14A.

FIG. 5 illustrates the step to form the perimeter vertical shield contacts 24 and the interior vertical shield contacts 26. Each perimeter vertical shield contact 24 is bonded to a corresponding perimeter bond pad 16, and each interior vertical shield contact 26 is bonded to a corresponding interior bond pad 18. As such, the perimeter vertical shield contacts 24 are coupled to ground via the perimeter bond pads 16, and surround the corresponding first and second electronic components 20 and 22. The interior vertical shield contacts 26 are coupled to ground via the interior bond pads 18, and located between the corresponding first and second electronic components 20 and 22. The perimeter vertical shield contacts 24 and the interior vertical shield contacts 26 may be formed by a wire bonding process. In some applications, if there is no interior bond pad 18 on the corresponding module substrate 14, there is no interior vertical shield contact 26 formed.

After the perimeter vertical shield contacts 24 and the interior vertical shield contacts 26 are formed, a plasma cleaning process (not shown) may be followed to clean the top surface of the package substrate 14A. Next, the mold compound 28 is applied over the top surface of the package substrate 14A to form a molding package 42 as depicted in FIG. 6. The mold compound 28 encapsulates the first electronic component 20, the second electronic component 22, the perimeter bond pads 16, the interior bond pads 18, the perimeter vertical shield contacts 24, and the interior vertical shield contacts 26 on each module substrate 14. The mold compound 28 may be applied by various processes, such as sheet molding, overmolding, compression molding, transfer molding, dam fill encapsulation, or screen print encapsulation. A curing process (not shown) is followed to harden the mold compound 28. The curing temperature is between 100° C. and 320° C. depending on which material is used as the mold compound 28.

The mold compound 28 is then thinned down to form a thinned molding package 44 as depicted in FIG. 7. The mold compound 28 is thinned down to expose the top tip of each perimeter vertical shield contact 24 and the top tip of each interior vertical shield contact 26. Since the height of each perimeter vertical shield contact 24/interior vertical shield contact 26 is taller than the height of the first electronic component 20/the second electronic component 22, when the top tip of each perimeter vertical shield contact 24/interior vertical shield contact 26 is exposed at the top surface of the mold compound 28, the first electronic component 20 and the second electronic component 22 are still fully encapsulated by the mold compound 28. Herein, thinning the mold compound 28 may be provided by a mechanical grinding process. An etching and/or a plasma cleaning process (not shown) may be followed to clean the top surface of the mold compound 28 and thus ensure that the exposed top tip of each perimeter/interior vertical shield contact 24/26 is electrically conductive.

Figure 8:
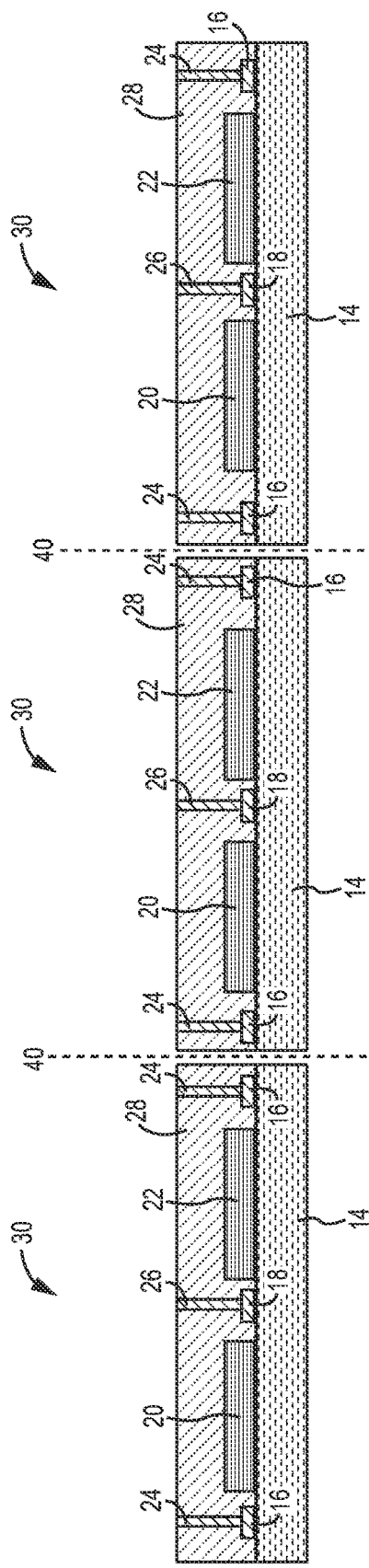

Next, the thinned molding package 44 is singulated at each inter-module area 40 to form a number of the individual integrated modules 30, as depicted in FIG. 8. Each integrated module 30 includes the module substrate 14, the first electronic component 20, the second electronic component 22, the perimeter bond pads 16, the interior bond pads 18, the perimeter vertical shield contacts 24, the interior vertical shield contacts 26, and the mold compound 28. The top tip of each perimeter vertical shield contact 24 and the top tip of each interior vertical shield contact 26 are exposed at the top surface of the mold compound 28. Herein, the top surface of each integrated module 30 is the top surface of the mold compound 28, the bottom surface of each integrated module 30 is a bottom surface of the module substrate 14, and a side surface of each integrated module 30 is a combination of the side surface of the mold compound 28 and the side surface of the module substrate 14.

Figure 9:
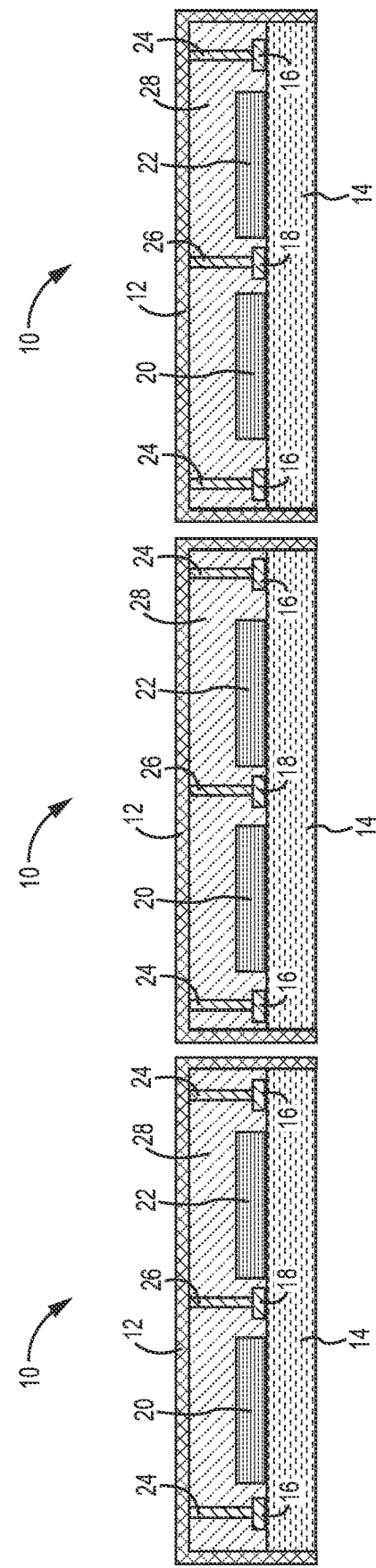

Finally, the shielding structure 12 is applied to each integrated module 30 to form a number of the shielded integrated modules 10, as depicted in FIG. 9. The shielding structure 12 completely covers the top surface and the side surface of each integrated module 30 without covering the bottom surface of each integrated module 30. The shielding structure 12 is in contact with the perimeter vertical shield contacts 24 and the interior vertical shield contacts 26, such that the shielding structure 12 is electrically coupled to ground via the perimeter vertical shield contacts 24 and the perimeter bond pads 16, and/or via the interior vertical shield contacts 26 and the interior bond pads 18. In some applications, if there is no interior bond pad 18 and interior vertical shield contact 26 between the corresponding first and second electronic components 20 and 22, the shielding structure 12 is only in contact with the perimeter vertical shield contacts 24 and electrically coupled to ground via the perimeter vertical shield contacts 24 and the perimeter bond pads 16.

The shielding structure 12 may include the seed layer 36, the first layer 32, and the second layer 34 (see FIG. 1A). In one embodiment, the seed layer 36 may be formed of copper, aluminum, silver, gold, or other conductive materials using a metal deposition, an electroless and/or electrolytic plating process; the first layer 32 may be formed of copper, aluminum, silver, gold, or other conductive materials using an electrolytic plating process; and the second layer 34 may be formed of nickel using an electroless and/or electrolytic plating process.

In an alternative embodiment, the order of the singulation process and the shielding process may be opposite. After the mold compound 28 is thinned down to expose the top tip of each perimeter vertical shield contact 24 and the top tip of each interior vertical shield contact 26, the shielding structure 12 is applied to the thinned molding package 44 to form a shielded molding package 46, as depicted in FIG. 10. Herein, a top surface of the thinned molding package 44 is the top surface of the mold compound 28, a bottom surface of the thinned molding package 44 is a bottom surface of the package substrate 14A, and a side surface of the thinned molding package 44 is a combination of the side surface of the mold compound 28 and a side surface of the package substrate 14A. The shielding structure 12 completely covers the top surface and the side surface of the thinned molding package 44 without covering the bottom surface of the thinned molding package 44. The shielding structure 12 is in contact with each perimeter vertical shield contact 24 and each interior vertical shield contact 26 within the thinned molding package 44, such that the shielding structure 12 is electrically coupled to ground via the perimeter vertical shield contacts 24 and the perimeter bond pads 16, and/or via the interior vertical shield contacts 26 and the interior bond pads 18.

The shielded molding package 46 is finally singulated at each inter-module area 40 to form a number of the shielded integrated modules 10, as depicted in FIG. 11. Each shielded integrated module 10 includes the integrated module 30 and the shielding structure 12. For each shielded integrated module 10, the shielding structure 12 may completely cover the top surface of the integrated module 30, while the bottom surface and the side surface of the integrated module 30 are exposed. The shielding structure 12 of each shielded integrated module 10 remains in contact with the perimeter vertical shield contacts 24 and the interior vertical shield contacts 26, and is coupled to ground.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
providing a precursor package having a plurality of integrated modules, wherein:
each of the plurality of integrated modules comprises a module substrate with a plurality of perimeter bond pads, at least one electronic component, a mold compound, and a plurality of perimeter vertical shield contacts;
the at least one electronic component and the plurality of perimeter bond pads are on a top surface of the module substrate and encapsulated by the mold compound, wherein the plurality of perimeter bond pads surround the at least one electronic component and are electrically coupled to ground; and
each of the plurality of perimeter vertical shield contacts is bonded to a corresponding perimeter bond pad, and extends through the mold compound, such that a top tip of each of the plurality of perimeter vertical shield contacts is exposed at a top surface of the mold compound;
applying a shielding structure completely over a top surface and a side surface of the precursor package to form a shielded package, such that the shielding structure is in contact with the plurality of perimeter vertical shield contacts associated with each of the plurality of integrated modules; and
singulating the shielded package into a plurality of shielded integrated modules, wherein:
each of the shielded integrated modules comprises one of the plurality of integrated modules and a corresponding individual shielding structure that is singulated from the shielding structure; and
a top surface of each of the plurality of integrated modules is completely covered by the corresponding individual shielding structure, and the corresponding individual shielding structure for each of the plurality of shielded integrated modules remains in contact with the plurality of perimeter vertical shield contacts.

2. The method of claim 1 wherein providing the precursor package comprises:
attaching the at least one electronic component to a corresponding module substrate, such that the plurality of perimeter bond pads on the corresponding module substrate surrounds the at least one electronic component;
forming each of the plurality of perimeter vertical shield contacts bonded to the corresponding perimeter bond pad;
applying the mold compound over each module substrate to encapsulate the at least one electronic component, the plurality of perimeter bond pads, and the plurality of perimeter vertical shield contacts; and
thinning the mold compound to expose the top tip of each of the plurality of perimeter vertical shield contacts.

3. The method of claim 2 wherein forming each of the plurality of perimeter vertical shield contacts is provided by a wire bonding process.

4. The method of claim 2 wherein thinning the mold compound is provided by a mechanical grinding process.

5. The method of claim 1 wherein the at least one electronic component comprises a first electronic component and a second electronic component, wherein the plurality of perimeter bond pads surrounds the first electronic component and the second electronic component.

6. The method of claim 5 wherein each of the plurality of integrated modules further comprises a plurality of interior bond pads, and a plurality of interior vertical shield contacts, wherein:
the plurality of interior bond pads is formed on the top surface of the corresponding module substrate, located between the first electronic component and the second electronic component, and electrically coupled to ground;
each of the plurality of interior vertical shield contacts is bonded to a corresponding interior bond pad, and extends through the mold compound, such that a top tip of each of the plurality of interior vertical shield contacts is exposed at the top surface of the mold compound; and
after applying the shielding structure, the shielding structure is in contact with the plurality of interior vertical shield contacts associated with each of the plurality of integrated modules.

7. The method of claim 6 wherein providing the precursor package comprises:
attaching the first electronic component and the second electronic component to the corresponding module substrate, wherein the plurality of perimeter bond pads on the corresponding module substrate surrounds the first electronic component and the second electronic component, and the plurality of interior bond pads on the corresponding module substrate is located between the first electronic component and the second electronic component;
forming each of the plurality of perimeter vertical shield contacts bonded to the corresponding perimeter bond pad, and forming each of the plurality of interior vertical shield contacts bonded to the corresponding interior bond pad;
applying the mold compound over each module substrate to encapsulate the first electronic component, the second electronic component, the plurality of perimeter bond pads, the plurality of interior bond pads, the plurality of perimeter vertical shield contacts, and the plurality of interior vertical shield contacts; and thinning the mold compound to expose the top tip of each of the plurality of perimeter vertical shield contacts and the top tip of each of the plurality of interior vertical shield contacts.

8. The method of claim 1 wherein each individual shielding structure comprises:
  a first layer completely covering the top surface of a corresponding one of the plurality of integrated modules, wherein the first layer is formed of copper, aluminum, silver, or gold; and
  a second layer over the first layer and formed of nickel.

9. The method of claim 8 wherein a thickness of the first layer is between 3 μm and 16 μm, and a thickness of the second layer is between 1 μm and 3 μm.

10. The method of claim 8 wherein the first layer is formed by an electrolytic plating process and the second layer is formed by at least one of an electroless plating process and an electrolytic plating process.

11. The method of claim 1 wherein each individual shielding structure comprises:
  a seed layer completely covering the top surface of a corresponding one the plurality of integrated modules, wherein the seed layer is formed of copper, aluminum, silver, or gold;
  a first layer over the seed layer and formed of copper, aluminum, silver, or gold; and
  a second layer over the first layer and formed of nickel.

12. The method of claim 11 wherein a thickness of the seed layer is between 0.5 μm and 1.5 μm, a thickness of the first layer is between 3 μm and 16 μm, and a thickness of the second layer is between 1 μm and 3 μm.

13. The method of claim 1 wherein the plurality of perimeter bond pads is formed from electroless nickel electroless palladium immersion gold (ENEPIG) or electroless nickel immersion gold (ENIG), and the plurality of perimeter vertical shield contacts are formed of copper, gold, or alloy.

14. The method of claim 1 wherein a distance between each of the plurality of perimeter bond pads and the at least one electronic component is between 60 μm and 100 μm.

15. The method of claim 1 wherein the at least one electronic component is at least one of a group consisting of a flip-chip die, a wire-bonding die, a surface mounted device (SMD), an inductor, a capacitor, and a resistor.

* * * * *